(12) United States Patent
Olbrich (10) Patent No.: US 11,398,806 B2
(45) Date of Patent: Jul. 26, 2022

(54) HYBRID PINNING PACKAGE FOR RADIO FREQUENCY FILTERS

(71) Applicant: RF360 Europe GmbH, Munich (DE)

(72) Inventor: Magnus Olbrich, Munich (DE)

(73) Assignee: RF360 Europe GmbH, Munich (DE)

( * ) Notice: Subject to any disclaimer, the term of this patent is extended or adjusted under 35 U.S.C. 154(b) by 43 days.

(21) Appl. No.: 17/016,137

(22) Filed: Sep. 9, 2020

(65) Prior Publication Data

US 2022/0077834 A1  Mar. 10, 2022

(51) Int. Cl.
| | |
|---|---|
| *H03H 3/08* | (2006.01) |
| *H03H 9/64* | (2006.01) |
| *H03H 1/00* | (2006.01) |
| *H03H 7/01* | (2006.01) |

(52) U.S. Cl.
CPC ............ *H03H 3/08* (2013.01); *H03H 1/0007* (2013.01); *H03H 7/0115* (2013.01); *H03H 9/64* (2013.01); *H03H 2001/0021* (2013.01)

(58) Field of Classification Search
CPC .................................. H03H 3/08; H03H 9/64
USPC ......................................... 333/175, 181, 193
See application file for complete search history.

(56) References Cited

FOREIGN PATENT DOCUMENTS

CN          200953375 Y      9/2007

OTHER PUBLICATIONS

International Search Report and Written Opinion—PCT/EP2021/074322—ISA/EPO—dated Jan. 5, 2022.

*Primary Examiner* — Rakesh B Patel
(74) *Attorney, Agent, or Firm* — Muncy, Geissler, Olds & Lowe, P.C./QUALCOMM

(57) ABSTRACT

Disclosed is a device and methods for making same. In one aspect, a device includes a package having at least four pins, and, within the package, a die that includes a filter circuit electrically coupled to the four pins. The filter can: receive, from a first pin, an input signal comprising first and second frequency components, produce, at a second pin, a first output signal of the first frequency component, and produce, at a third and fourth pin, a second output signal of the second frequency component; and/or receive, from a second pin, a first input signal comprising the first frequency component, receive, from a third or fourth pin, a second input signal comprising the second frequency component, and produce, at a first pin, an output signal comprising the first and second frequency components. The second pin is interposed between the third and fourth pins on the package.

18 Claims, 7 Drawing Sheets

HYBRID PINNING PACKAGE FOR RADIO FREQUENCY FILTERS

FIELD OF DISCLOSURE

This disclosure relates generally to radio frequency filters, and more specifically, but not exclusively, to hybrid pinning packages for radio frequency filters and fabrication techniques thereof.

BACKGROUND

Global Navigation Satellite System (GNSS) is a generic term for satellite navigation systems that provide autonomous geo-spatial positioning with global coverage, such as the Global Positioning System (GPS) and other systems. GNSS satellites transmit in different in frequency bands; two of which, known as L1 and L5, are for civilian use. Makers of automotive GPS systems, for example, may produce a module that includes a printed circuit board (PCB) having a GPS antenna mounted to one side and semiconductor devices mounted on the other side. To reduce cost, such modules may use single layer PCBs, which do not allow for signal traces to cross over each other. As will now be explained, this constraint can cause problems.

For example, GPS systems receive GPS signals of multiple frequencies in the 1-2 gigahertz (GHz) range, and a GPS receiver usually needs to filter out all frequencies except L1 and L5, which must be amplified, e.g., by a low noise amplifier (LNA). Some GPS receivers perform the filter step before the amplifying step while other GPS receivers perform the amplifying step before the filter step. These two approaches are referred to a "pre-LNA filtering" and "post-LNA filtering" respectively.

Surface acoustic wave (SAW) and bulk acoustic wave (BAW) filters are devices which make use of the properties of piezoelectric material to convert electrical signals to acoustic waves and back to electrical signals, and are thus commonly referred to as "acoustic devices". The dimensions of the piezoelectric substrate can be tuned such that specific frequencies are allowed or blocked, making acoustic devices ideal radio frequency (RF) filters. Because acoustic waves can travel in both directions, these devices may be bidirectional.

Figure 1:
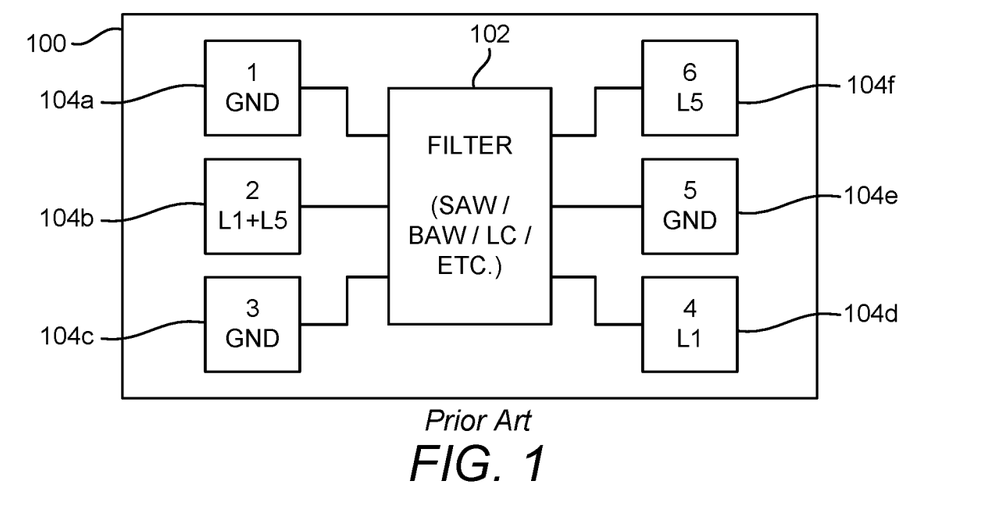
FIG. 1 a schematic of a conventional RF device.

FIG. 1 a schematic of a conventional RF device 100 that includes a filter circuit 102, which may be a SAW device, a BAW device, a conventional inductor/capacitor (LC) filter, or other type of filter. RF device 100 typically includes electrical connections 104a-104f, which may be bonding pads, under bump metallization (UBM), or other structures, but will be referred to generically herein as "pins". In the example shown in FIG. 1, device 100 has six pins, numbered 1 through 6. The term "pinning" refers to the mapping of device connections to package pins. In the example shown in FIG. 1, device 100 has the following pinning: pins 1, 3, and 5 are ground connections; pin 2 is electrically coupled to one end of the filter circuit 102, and pin 4 and pin 6 are electrically coupled to the other end of the filter circuit 102.

In the example shown in FIG. 1, if a signal containing frequencies L1 and L5 is input into pin 2, then a signal having frequency L1 will be output on pin 4 and a signal having frequency L5 will be output on pin 6. If the filter circuit 102 is a SAW or BAW filter, the reverse is also true: if a signal containing frequency L1 is input into pin 4 and a signal containing frequency L5 is input into pin 6, then a signal having frequencies L1 and L5 will be output from pin 2.

Figure 2:
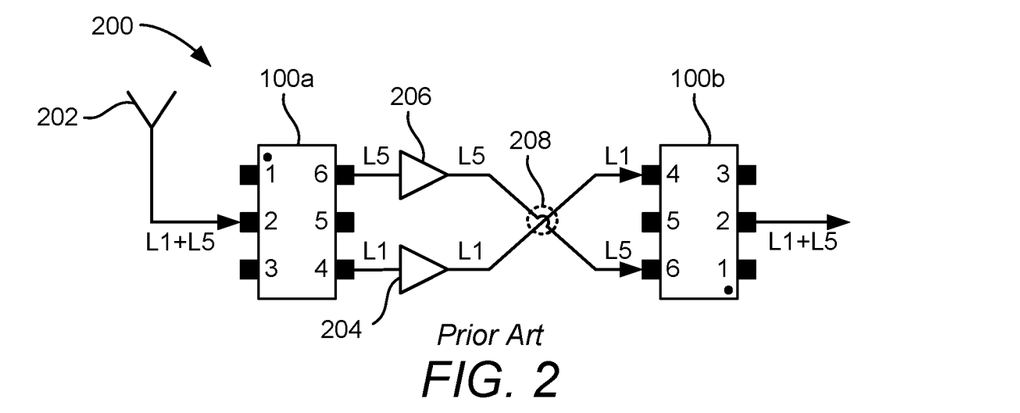
FIG. 2 illustrates a portion of a conventional circuit using two instances of a conventional RF device.

FIG. 2 illustrates a portion of a conventional circuit 200 using two instances of conventional RF device 100, labeled 100a and 100b in FIG. 2. In FIG. 2, an antenna 202 supplies a signal containing frequencies L1 and L5 to pin 2 of device 100a, which filters the input and outputs frequency L1 from pin 4 and frequency L5 from pin 6. The signal output by pin 4 is sent to a first LNA 204 and the signal output by pin 6 is sent to a second LNA 206. The first LNA 204 and the second LNA 206 may be identical, or each may be separately optimized to handle their respective frequencies L1 and L5. The amplified signals are then combined by device 100b, which outputs a signal containing both frequencies L1 and L5.

In FIG. 2, the two instances of the same RF device 100 are used: one to split a signal containing L1+L5 into separate L1 and L5 feeds, and another to combine the separate L1 and L5 feeds to create a signal containing L1+L5. However, because of the specific pinning of devices 100a and 100b, the metal trace for routing the output of the first LNA 204 must cross over (or under) the metal trace for routing the output of the second LNA 206—shown in FIG. 2 as highlighted area 208—in order to reach their intended destinations at device 100b. This means that at least two levels of routing are required.

Figure 3:
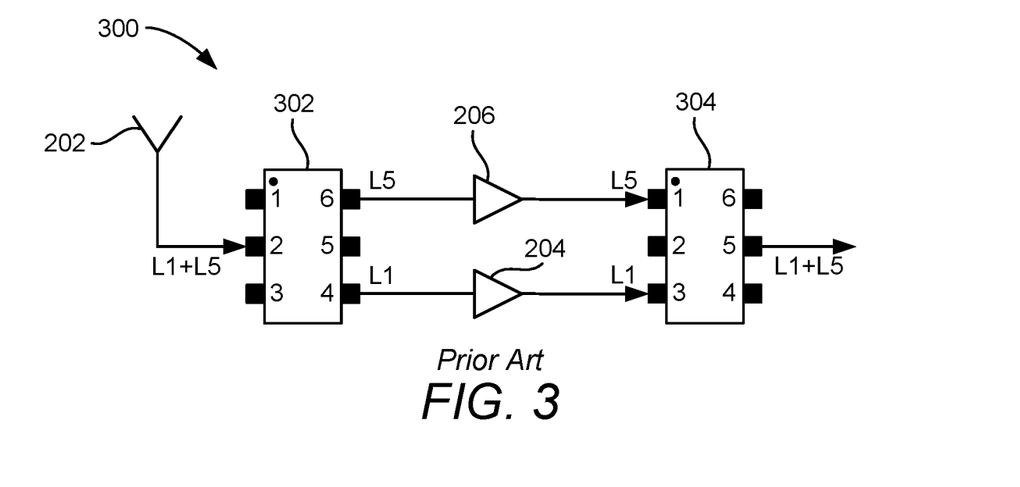
FIG. 3 illustrates a portion of a conventional circuit in which a crossover is avoided by using two different versions of the same device, each version having a different pinning.

FIG. 3 illustrates a portion of another conventional circuit 300, in which a crossover is avoided by using two different versions of the same device, each version having a different pinning. In FIG. 3, RF device 302 has the same pinning as the RF device 100 described above in FIG. 1, but RF device 304 has a different pinning, e.g., as shown in FIG. 3, which means that RF device 302 and RF device 304 are not interchangeable even though their functions are the same. This circuit 300 does not have a crossover but does require the use of different parts, with all the attendant disadvantages associated with a larger parts list for manufacturing.

Either approach has disadvantages: using the same pinning for both devices requires the use of PCBs with more than one routing layer, which increases cost; using devices with different pinning increases the complexity of the manufacturing process, which has to account for different variants of the same device function. Thus, there is a need for a better approach having none of the disadvantages of the conventional approaches described above.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes a device that includes a package having at least a first pin, a second pin, a third pin, and a fourth pin. The device also includes a die, disposed within the package. The die includes a filter circuit that is electrically coupled to the first pin, the second pin, the third pin, and the fourth pin, and that is operable to: receive, from the first pin, an input signal comprising a first frequency component and a second frequency component, produce, at the second pin, a first output signal comprising the first frequency component, and produce, at the third pin and at the fourth pin, a second output signal comprising the second frequency component; and/or receive, from the second pin, a first input signal comprising the first frequency component, receive, from the third pin or the fourth pin, a second input signal comprising the second frequency component, and produce, at the first pin, an output signal comprising the first frequency component and the second frequency component. The second pin is interposed between the third pin and the fourth pin on the package.

In accordance with the various aspects disclosed herein, at least one aspect includes, a method for fabricating a device. The method includes providing a package having at least a first pin, a second pin, a third pin, and a fourth pin. The method also includes providing a die, disposed within the package, that comprises a filter circuit that is electrically coupled to the first pin, the second pin, the third pin, and the fourth pin, and that is operable to: receive, from the first pin, an input signal comprising a first frequency component and a second frequency component, produce, at the second pin, a first output signal comprising the first frequency component, and produce, at the third pin and at the fourth pin, a second output signal comprising the second frequency component; and/or to receive, from the second pin, a first input signal comprising the first frequency component, receive, from the third pin or the fourth pin, a second input signal comprising the second frequency component, and produce, at the first pin, an output signal comprising the first frequency component and the second frequency component. The second pin is interposed between the third pin and the fourth pin on the package.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, wherein like reference numbers represent like parts, which are presented solely for illustration and not limitation of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 4:
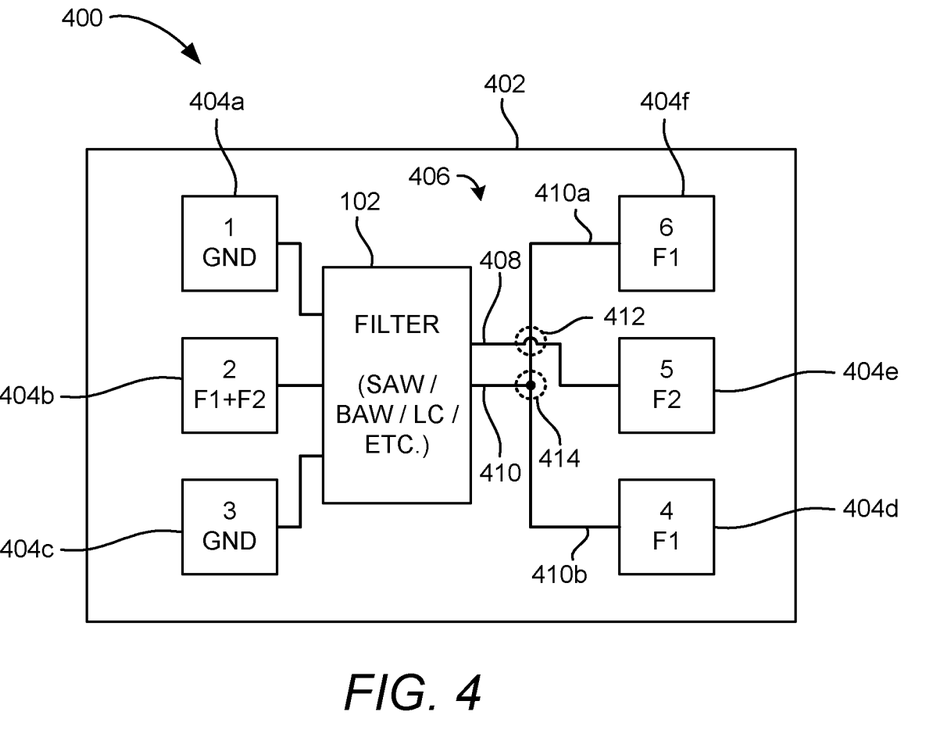
FIG. 4 illustrates an exemplary RF device according to one or more aspects of the disclosure.

FIG. 4 illustrates an exemplary RF device 400 according to one or more aspects of the disclosure. In FIG. 4, the RF device 400 includes a package 402 having electrical connections 404a-404f, which may be bonding pads, under bump metallization (UBM), or other structures, but will be referred to generically herein as "pins". In FIG. 4, electrical connections 404a through 404f correspond to pins 1 through 6. The package 402 houses a die 406 that includes a filter circuit 102, which may be a surface acoustic wave (SAW) device, a bulk acoustic wave (BAW) device, an inductor/capacitor (LC) filter, or another filter. The term "pinning" refers to the mapping of device connections to package pins. In the example shown in FIG. 4, device 400 has the following pinning: pins 1 and 3 are ground connections; pin 2 is electrically coupled to one end of the filter circuit 102, and pins 4-6 are electrically coupled to the other end of the filter circuit 102. For reasons that will be explained in more detail below, pin 5 is located in-between pin 4 and pin 6.

According to some aspects, the filter circuit 102 may be operable to receive, from a first pin (e.g., pin 2 in FIG. 4), an input signal comprising a first frequency component and a second frequency component, and to produce, at a second pin (e.g., pin 5 in FIG. 4), a first output signal comprising the first frequency component, and also produce, at a third pin and a fourth pin (e.g., pin 4 and pin 6 in FIG. 4), a second output signal comprising the second frequency component.

According to some aspects, the filter circuit 102 may be operable to receive, from the second pin (e.g., pin 5 in FIG. 4), a first input signal comprising the first frequency component, and receive, from the third pin or the fourth pin (e.g., pin 4 and pin 6 in FIG. 4), a second input signal comprising the second frequency component, and to produce, at the first pin (e.g., pin 2 in FIG. 4), an output signal comprising the first frequency component and the second frequency component.

According to some aspects, the first frequency component may be one of the Global Navigation Satellite System (GNSS) frequencies and the second frequency component may be another of the GNSS frequencies, e.g., L1 and L5, respectively.

In FIG. 4, the filter circuit 102 is electrically coupled to pin 5 by first conductor 408, and the filter circuit 102 is electrically coupled to pin 4 and pin 6 by a second conductor 410. According to some aspects, the first conductor 408 crosses over or under the second conductor 410 at a crossover structure 412 having an insulation layer that electrically isolates the first conductor 408 from the second conductor 410. According to some aspects, the second conductor 410 includes a Y-branch 414 that splits the second conductor 410 into two branches, labelled 410a and 410b in FIG. 4. According to some aspects, the Y-branch 414 is a galvanic, rather than inductive or capacitive, connection.

According to some aspects, the crossover structure 412 is fabricated on the same die as the filter circuit 102, e.g., using one or more metal layers separated by a passivation layer, optionally using vias and contacts created by standard wafer processes. According to other aspects, the crossover structure 412 is part of the package 402, e.g., using different layers of a multi-layer PCB or laminate substrate, connected by vias.

Figure 5:
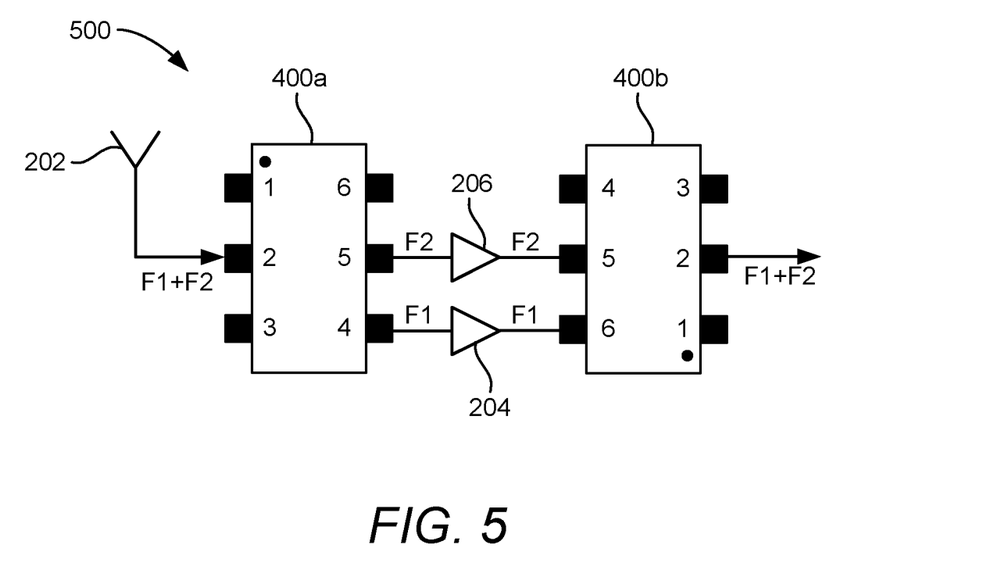
FIG. 5 illustrates a portion of an example circuit using two instances of the exemplary RF device according to one or more aspects of the disclosure.

FIG. 5 illustrates a portion of an example circuit 500 using two instances of RF device 400, labeled 400a and 400b in FIG. 5. In FIG. 5, an antenna 202 supplies a signal containing frequencies F1 and F2 to pin 2 of device 400a, which filters the input and outputs frequency F1 from pin 4 and pin 6 and frequency F2 from pin 5. The signal output by pin 4 is sent to a first LNA 204 and the signal output by pin 5 is sent to a second LNA 206. In the example shown in FIG. 5, pin 6 of device 400a is unused. The first LNA 204 and the second LNA 206 may be identical, or each may be separately optimized to handle their respective frequencies F1 and F2. The amplified signal F1 is routed from the output of the first LNA 204 to pin 6 of device 400b, and the amplified signal F2 is routed from the output of the second LNA 206 to pin 5 of device 400b. In the example shown in FIG. 5, pin 4 of device 400b is unused. The amplified signals are then combined by device 400b, which outputs a signal containing both frequencies F1 and F2 on pin 2 of device 400b. FIG. 5 illustrates the point that by using identical devices 402a and 402b, a circuit, such as circuit 500, may be created that does not require a line crossing, unlike conventional circuit 200 in FIG. 2, and does not require the use of differently-pinned parts, unlike conventional circuit 300 in FIG. 3.

According to some aspects, each of the unused pins, e.g., pin 6 of device 400a and pin 4 of device 400b, may be attached to a respective bonding pad on a PCB for structural support of the devices, where each respective bonding pad on the PCB is electrically isolated from anything else on the PCB. According to some aspects, the portion of the second conductor 410 from the Y-branch 414 to an unused pin (e.g., branch 410a in device 400a and branch 410b in device 400b in FIG. 5) is considered to be an RF stub; it is known to one of ordinary skill in the art that an RF stub will have a negligible effect on the circuit if the length of the RF stub is less than about $\frac{1}{10}^{th}$ of the wavelength of an RF signal carried by that stub, and may have an acceptably small effect on the circuit if the length of the RF stub is less than about $\frac{1}{4}^{th}$ of the wavelength of an RF signal carried by that stub.

Thus, in some aspects, the length of the portion of the second conductor 410 from the Y-branch 414 to an unused pin is less than $\frac{1}{10}^{th}$ of the wavelength of the RF signal carried by the first conductor 408. In other aspects, the length of the portion of the first conductor 408 from the Y-branch 414 to an unused pin is greater than $\frac{1}{10}^{th}$ but less than $\frac{1}{4}^{th}$ of the wavelength of the RF signal carried by the second conductor 410, and the difference in length of the two branches is less than $\frac{1}{10}^{th}$ of the wavelength of the RF signal carried by the second conductor 410. Here, the length of the RF stub from the Y-branch 414 to an unused pin of a typical package will be on the order of tens of millimeters, while the wavelength of 3 GHz signals is on the order of tens of centimeters. Thus, for frequencies of 3 GHz or less, the RF stub will have negligible effect on the operation of device 400a and device 400b. The concepts described herein may also be applicable for frequencies higher than 3 GHz, e.g., where the length of the RF stub can be fabricated such that it is less than $\frac{1}{10}^{th}$ of the wavelength of the RF signal, or where the length of the RF stub is less than $\frac{1}{4}^{th}$ of the wavelength and the difference in lengths of the branches is less than $\frac{1}{10}^{th}$ of the wavelength of the RF signal, for example.

Figure 6:
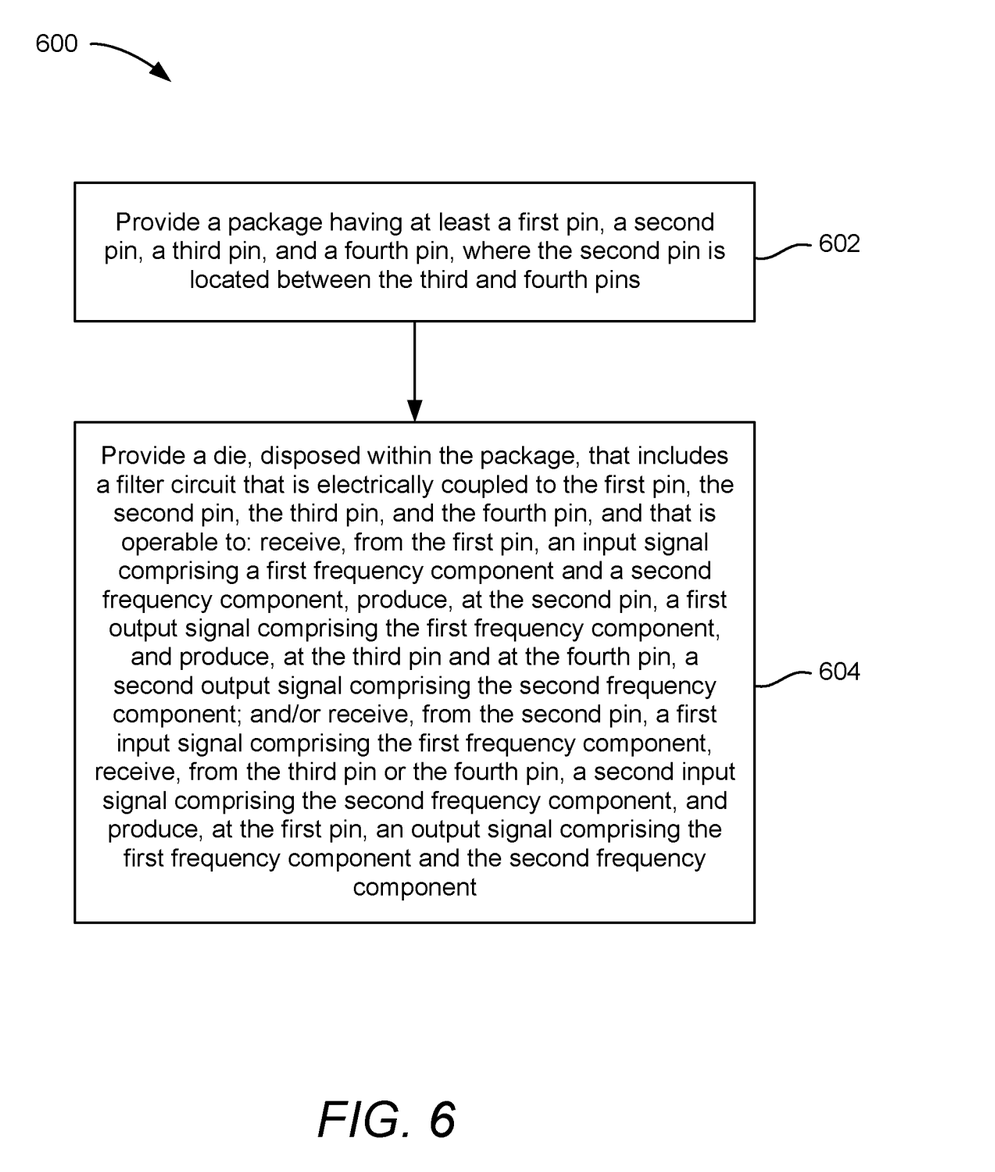
FIG. 6 illustrates a flowchart of an exemplary partial method for manufacturing a device according to one or more aspects of the disclosure.

FIG. 6 illustrates a flowchart of an exemplary partial method 600 for manufacturing a device in accordance with some examples of the disclosure. As shown in FIG. 6, the partial method 600 may begin in block 602 with providing a package 402 having at least a first pin 404b, a second pin 404e, a third pin 404d, and a fourth pin 404f, where the second pin 404e is located between the third pin 404d and fourth pin 404f of the package 402. The partial method 600 may continue in block 604 with providing a die 406, disposed within the package 402, that includes a filter circuit 102 that is electrically coupled to the first, second, third, and fourth pins, and that is operable to: receive, from the first pin 404b, an input signal comprising a first frequency component and a second frequency component, produce, at the second pin 404e, a first output signal comprising the first frequency component, and produce, at the third pin 404d and at the fourth pin 404f, a second output signal comprising the second frequency component; and/or receive, from the second pin 404e, a first input signal comprising the first frequency component, receive, from the third pin 404d or the fourth pin 404f, a second input signal comprising the second frequency component, and produce, at the first pin 404b, an output signal comprising the first frequency component and the second frequency component.

Figure 7:
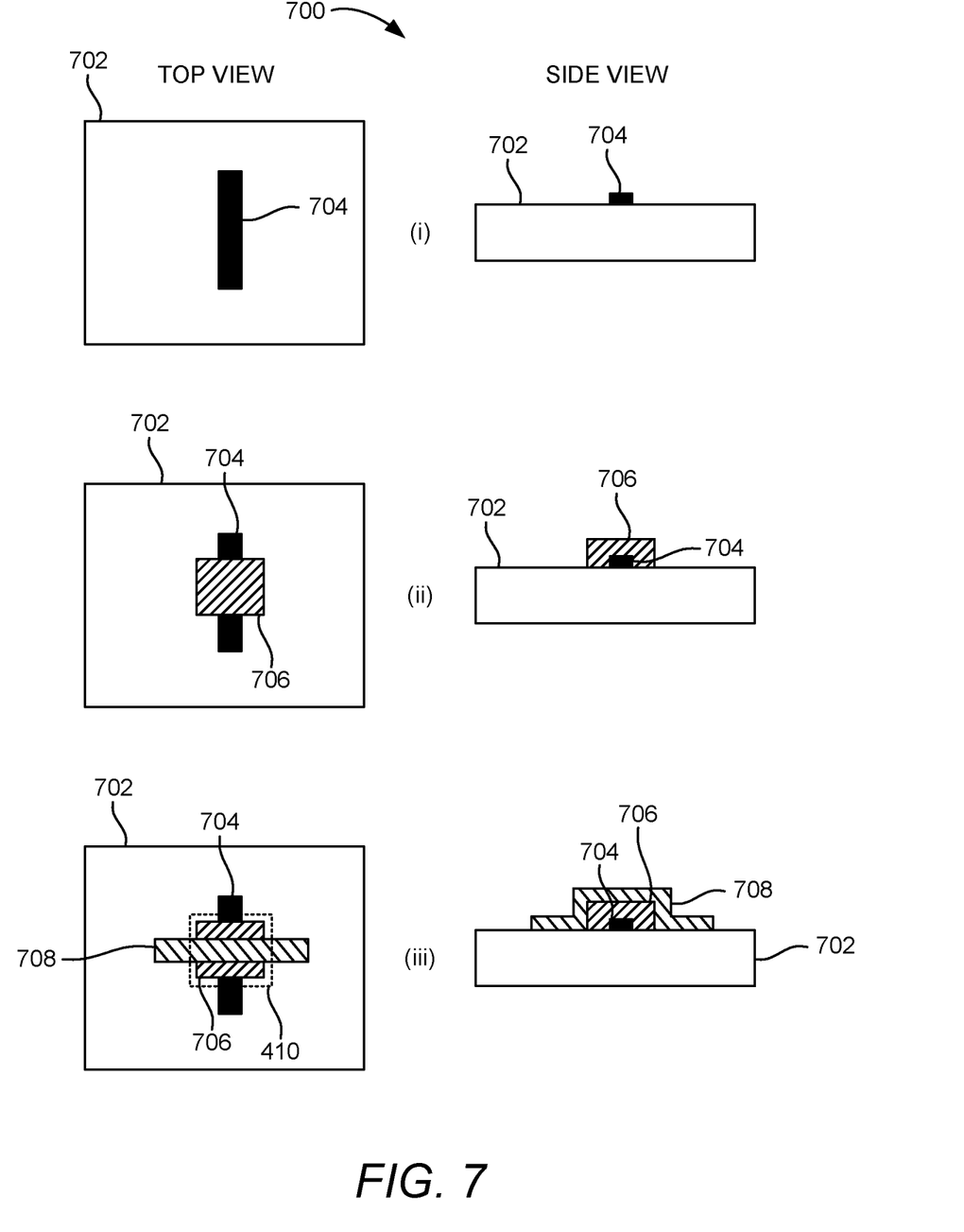
FIG. 7 illustrates an exemplary fabrication technique for a crossover structure according to one or more aspects of the disclosure.

FIG. 7 illustrates an exemplary fabrication technique for a crossover structure 412 according to one or more aspects of the disclosure. FIG. 7, which is not so scale, illustrates an exemplary crossover structure 412 constructed using a wafer process. In FIG. 7, the crossover structure 412 is fabricated on a substrate 702, which may be a portion of die 406 in FIG. 4. Referring to FIG. 7, in a partial process 700 portion (i), a first conductor 704 is provided on a top surface of the substrate 702. In a partial process 700 portion (ii), an insulation layer 706 is provided above the first conductor 704. In a partial process 700 portion (iii), a second conductor 708 is provided above the insulation layer 706. In this manner, a crossover structure 412 is constructed with an insulation layer 706 that electrically isolates the first conductor 704 from the second conductor 708 within the crossover structure 412. According to some aspects, the first conductor 704 and second conductor 708 may be constructed of different metallization layers using copper or any other conducting material. According to some aspects, the insulation layer 706 may be constructed of silicon dioxide or any other insulating material.

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 8:
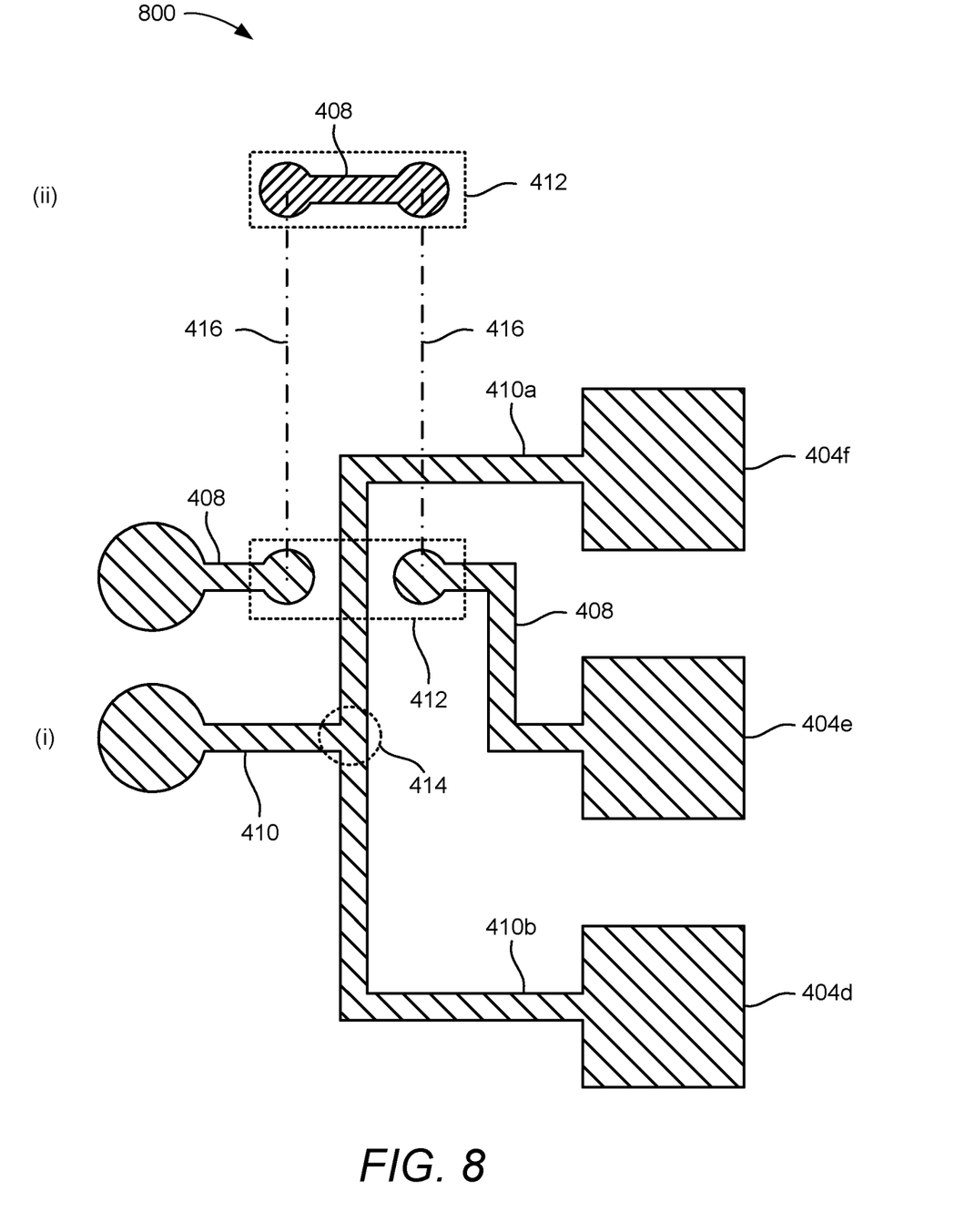
FIG. 8 illustrates an exemplary crossover structure 412 according to one or more aspects of the disclosure.

FIG. 8 illustrates a portion of a package 800 containing an exemplary crossover structure 412 according to one or more aspects of the disclosure. FIG. 8, which is not to scale, illustrates an exemplary crossover structure 412 in a package substrate, such as laminate package substrates or other packaging structure. In FIG. 8, two different conductive layers, labelled (i) and (ii), are shown. In FIG. 8, layer (i) contains the traces for first conductor 408 and second conductor 410, as well for the Y-branch 414 and pins 404d, 404e, and 404f. Layer (i) also includes a first portion of the crossover structure 412. In FIG. 8, layer (ii) contains a second portion of the crossover structure 412, i.e., a portion of the first conductor 408 that is routed over (or under) second conductor 410 using vias 416 to galvanically connect the two layers, which completes the electrical path from the filter circuit 102 to pin 404e.

Device 400 provides several technical advantages, including but not limited to the following. The internal crossover structure 412 allows the same device to be used on a single-layer PCB. This obviates the need to either use a more expensive multi-layer PCB or use parts that have identical function but different pinnings.

Figure 9:
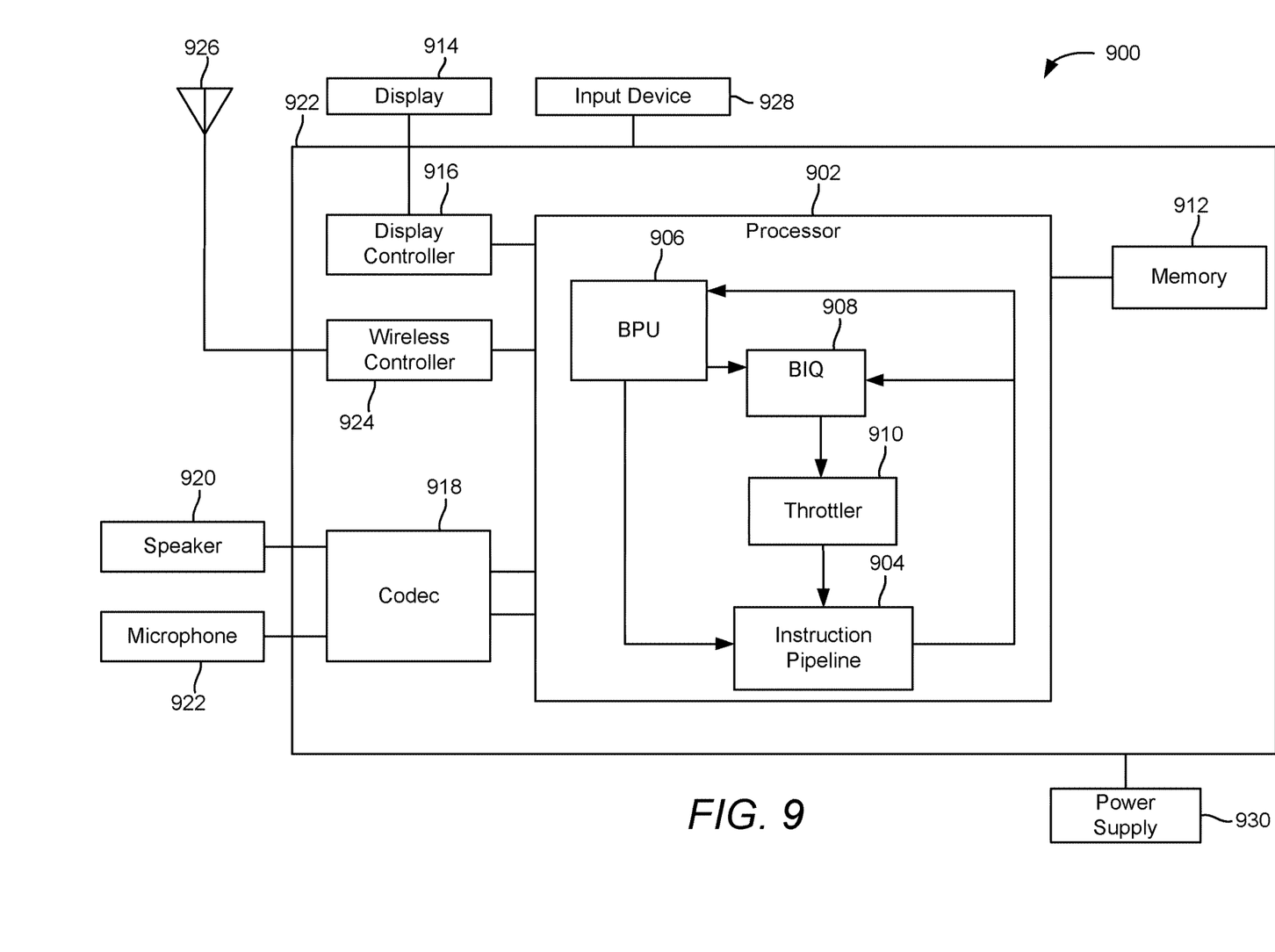
FIG. 9 illustrates an exemplary mobile device in accordance with one or more aspects of the disclosure.

FIG. 9 illustrates an exemplary mobile device in accordance with some examples of the disclosure. Referring now to FIG. 9, a block diagram of a mobile device that is configured according to exemplary aspects is depicted and generally designated mobile device 900. In some aspects, mobile device 900 may be configured as a wireless communication device. As shown, mobile device 900 includes processor 902. Processor 902 is shown to comprise instruction pipeline 904, buffer processing unit (BPU) 906, branch instruction queue (BIQ) 908, and throttler 910 as is well known in the art. Other well-known details (e.g., counters, entries, confidence fields, weighted sum, comparator, etc.) of these blocks have been omitted from this view of processor 902 for the sake of clarity. Processor 902 may be communicatively coupled to memory 912 over a link, which may be a die-to-die or chip-to-chip link. Mobile device 900 also includes display 914 and display controller 916, with display controller 916 coupled to processor 902 and to display 914.

In some aspects, FIG. 9 may include coder/decoder (CODEC) 918 (e.g., an audio and/or voice CODEC) coupled to processor 902; speaker 920 and microphone 922 coupled to CODEC 918; and wireless controller circuits 924 (which may include a modem, radio frequency (RF) circuitry, filters, etc., which may be implemented using one or more flip-chip devices, as disclosed herein) coupled to wireless antenna 926 and to processor 902.

In a particular aspect, where one or more of the above-mentioned blocks are present, processor 902, display controller 916, memory 912, CODEC 918, and wireless controller circuits 924 can be included in a system-in-package or system-on-chip device, including but not limited to package 402, which may be implemented in whole or part using the techniques disclosed herein. Input device 928 (e.g., physical or virtual keyboard), power supply 930 (e.g., battery), display 914, input device 928, speaker 920, microphone 922, wireless antenna 926, and power supply 930 may be external to system-on-chip device and may be coupled to a component of system-on-chip device, such as an interface or a controller.

It should be noted that although FIG. 9 depicts a mobile device, the processor 902 and memory 912 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 10:
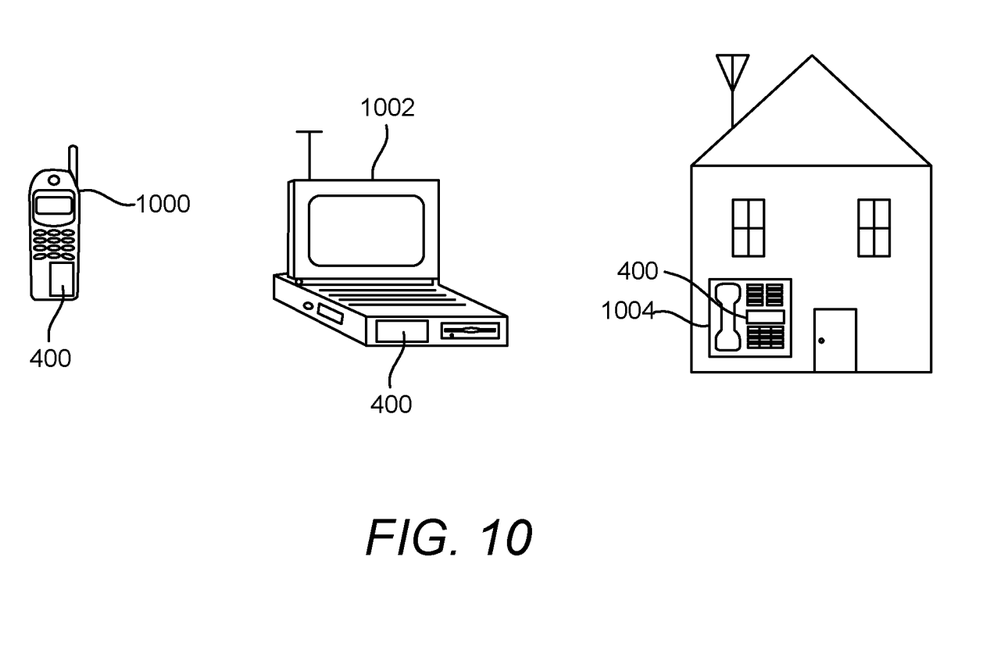
FIG. 10 illustrates various electronic devices that may be integrated with any of the aforementioned integrated device or semiconductor device in accordance with one or more aspects of the disclosure.

FIG. 10 illustrates various electronic devices that may be integrated with any of the aforementioned integrated device or semiconductor device accordance with various examples of the disclosure. For example, a mobile phone device 1000, a laptop computer device 1002, and a fixed location terminal device 1004 may each be considered generally user equipment (UE) and may include a device 400 as described herein, for example. The device 400 may be, for example, any of the integrated circuits, dies, integrated devices, integrated device packages, integrated circuit devices, device packages, integrated circuit (IC) packages, package-on-package devices described herein. The mobile phone device 1000, laptop computer device 1002, and fixed location terminal device 1004 illustrated in FIG. 10 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed packages, devices, and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a flip-chip or other package. The packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 4-10 may be rearranged and/or combined into a single component, process, feature or function or incorporated in several components, processes, or functions. Additional elements, components, processes, and/or functions may also be added without departing from the disclosure. It should also be noted that FIGS. 4-10 and corresponding description in the present disclosure are not limited to dies and/or ICs. In some implementations, FIGS. 4-10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), wide-band CDMA (W-CDMA), time division multiple access (TDMA), frequency division multiple access (FDMA), orthogonal frequency division multiplexing (OFDM), global system for mobile communications (GSM), the third generation partnership project (3GPP) long term evolution (LTE), fifth generation (5G) new radio (NR), Bluetooth (BT), Bluetooth low energy (BLE), IEEE 802.11 (WiFi), and IEEE 802.15.4 (Zigbee/Thread) or other protocols that may be used in a wireless communications network or a data communications network. Bluetooth low energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device, comprising:
   a package having at least a first pin, a second pin, a third pin, and a fourth pin; and
   a die, disposed within the package, that comprises a filter circuit that is electrically coupled to the first pin, the second pin, the third pin, and the fourth pin, and that is operable to:
   receive, from the first pin, an input signal comprising a first frequency component and a second frequency component; produce, at the second pin, a first output signal comprising the first frequency component; and produce, at the third pin and at the fourth pin, a second output signal comprising the second frequency component; and/or
   receive, from the second pin, a first input signal comprising the first frequency component; receive, from the third pin or the fourth pin, a second input signal comprising the second frequency component; and produce, at the first pin, an output signal comprising the first frequency component and the second frequency component; and
   wherein the second pin is interposed between the third pin and the fourth pin on the package.

2. The device of claim 1, wherein:
   the filter circuit is electrically coupled to the second pin via a first conductor; and
   the filter circuit is electrically coupled to the third pin and the fourth pin via a second conductor.

3. The device of claim 2, wherein the first conductor crosses over or under the second conductor using a crossover structure comprising an insulation layer that electrically isolates the first conductor from the second conductor within the crossover structure.

4. The device of claim 3, wherein the die comprises the crossover structure.

5. The device of claim 3, wherein the package comprises the crossover structure.

6. The device of claim 1, wherein the filter circuit comprises a surface acoustic wave (SAW) device.

7. The device of claim 1, wherein the filter circuit comprises a bulk acoustic wave (BAW) device.

8. The device of claim 1, wherein the filter circuit comprises an inductor and capacitor (LC) circuit.

9. The device of claim 1, wherein the filter circuit is bidirectional.

10. A method for fabricating a device, the method comprising:
    providing a package having at least a first pin, a second pin, a third pin, and a fourth pin; and
    providing a die, disposed within the package, that comprises a filter circuit that is electrically coupled to the first pin, to the second pin, to the third pin, and to the fourth pin, and that is operable to:
    receive, from the first pin, an input signal comprising a first frequency component and a second frequency component; produce, at the second pin, a first output signal comprising the first frequency component; and produce, at the third pin and at the fourth pin, a second output signal comprising the second frequency component; and/or
    receive, from the second pin, a first input signal comprising the first frequency component; receive, from the third pin or the fourth pin, a second input signal comprising the second frequency component; and produce, at the first pin, an output signal comprising the first frequency component and the second frequency component; and wherein the second pin is interposed between the third pin and the fourth pin on the package.

11. The method of claim 10, wherein:

the filter circuit is electrically coupled to the second pin via a first conductor; and the filter circuit is electrically coupled to the third pin and the fourth pin via a second conductor.

12. The method of claim 11, wherein the first conductor crosses over or under the second conductor using a crossover structure comprising an insulation layer that electrically isolates the first conductor from the second conductor within the crossover structure.

13. The method of claim 12, wherein the die comprises the crossover structure.

14. The method of claim 12, wherein the package comprises the crossover structure.

15. The method of claim 10, wherein the filter circuit comprises a surface acoustic wave (SAW) device.

16. The method of claim 10, wherein the filter circuit comprises a bulk acoustic wave (BAW) device.

17. The method of claim 10, wherein the filter circuit comprises an inductor and capacitor (LC) circuit.

18. The method of claim 10, wherein the filter circuit is bidirectional.

* * * * *